US007009154B2

(12) United States Patent
Villa et al.

(10) Patent No.: US 7,009,154 B2
(45) Date of Patent: *Mar. 7, 2006

(54) PROCESS FOR MANUFACTURING INTEGRATED CHEMICAL MICROREACTORS OF SEMICONDUCTOR MATERIAL

(75) Inventors: Flavio Villa, Milan (IT); Ubaldo Mastromatteo, Bareggio (IT); Gabriele Barlocchi, Cornaredo (IT); Mauro Cattaneo, Sedriano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 10/784,509

(22) Filed: Feb. 23, 2004

(65) Prior Publication Data

US 2004/0164068 A1    Aug. 26, 2004

Related U.S. Application Data

(63) Continuation of application No. 09/874,382, filed on Jun. 4, 2001, now Pat. No. 6,710,311.

(51) Int. Cl.
*C12M 1/34* (2006.01)
*G01N 33/487* (2006.01)
*H05B 3/02* (2006.01)

(52) U.S. Cl. .................. 219/521; 219/201; 435/287.2; 435/288.5

(58) Field of Classification Search ............... 219/521, 219/522, 544; 435/286.5, 287.2, 288.5

See application file for complete search history.

(56) References Cited

U.S. PATENT DOCUMENTS

| 4,993,143 A | 2/1991 | Sidner et al. |
| 5,429,734 A | 7/1995 | Gajar et al. |
| 5,498,392 A | 3/1996 | Wilding et al. |
| 5,637,469 A | 6/1997 | Wilding et al. |
| 5,639,423 A | 6/1997 | Northrup et al. |
| 5,690,841 A | 11/1997 | Elderstig |

(Continued)

FOREIGN PATENT DOCUMENTS

EP    1043770 A1    10/2000

(Continued)

OTHER PUBLICATIONS

Zhang, "Automated and Integrated System for High-Throughput DNA Genotyping Directly from Blood", Analytical Chemistry, vol. 71, No. 6, Mar. 1999.

(Continued)

*Primary Examiner*—Joseph Pelham
(74) *Attorney, Agent, or Firm*—Baker & McKenzie LLP

(57) ABSTRACT

The microreactor is completely integrated and is formed by a semiconductor body having a surface and housing at least one buried channel accessible from the surface of the semiconductor body through two trenches. A heating element extends above the surface over the channel and a resist region extends above the heating element and defines an inlet reservoir and an outlet reservoir. The reservoirs are connected to the trenches and have, in cross-section, a larger area than the trenches. The outlet reservoir has a larger area than the inlet reservoir. A sensing electrode extends above the surface and inside the outlet reservoir.

15 Claims, 5 Drawing Sheets

U.S. PATENT DOCUMENTS

| | | | |
|---|---|---|---|
| 5,856,174 A | 1/1999 | Lipshutz et al. | |
| 5,922,591 A | 7/1999 | Anderson et al. | |
| 5,928,880 A | 7/1999 | Wilding et al. | |
| 5,932,100 A | 8/1999 | Yager et al. | |
| 5,939,312 A | 8/1999 | Baier et al. | |
| 5,942,443 A | 8/1999 | Parce et al. | |
| 5,955,028 A | 9/1999 | Chow | |
| 6,040,193 A | 3/2000 | Winkler et al. | |
| 6,046,056 A | 4/2000 | Parce et al. | |
| 6,057,149 A | 5/2000 | Burns et al. | |
| 6,071,478 A | 6/2000 | Chow | |
| 6,132,580 A | 10/2000 | Mathies et al. | |
| 6,168,948 B1 | 1/2001 | Anderson et al. | |
| 6,261,431 B1 | 7/2001 | Mathies et al. | |
| 6,267,858 B1 | 7/2001 | Parce et al. | |
| 6,271,021 B1 | 8/2001 | Burns et al. | |
| 6,376,291 B1 | 4/2002 | Barlocchi et al. | |
| 6,403,367 B1 | 6/2002 | Cheng et al. | |
| 6,420,143 B1 | 7/2002 | Kopf-Sill | |
| 6,440,725 B1 | 8/2002 | Pourahmadi et al. | |
| 6,475,722 B1 * | 11/2002 | Henck | 435/285.2 |
| 6,518,022 B1 | 2/2003 | Sosnowski et al. | |
| 6,558,944 B1 * | 5/2003 | Parce et al. | 435/287.2 |
| 6,599,736 B1 * | 7/2003 | McCaskill et al. | 435/288.5 |
| 6,632,655 B1 * | 10/2003 | Mehta et al. | 435/288.5 |
| 6,673,593 B1 * | 1/2004 | Mastromatteo et al. | 435/287.2 |
| 6,710,311 B1 * | 3/2004 | Villa et al. | 219/521 |
| 6,727,479 B1 * | 4/2004 | Villa et al. | 219/521 |
| 6,770,471 B1 * | 8/2004 | Barlocchi et al. | 435/287.2 |
| 2001/0036672 A1 | 11/2001 | Anderson et al. | |
| 2002/0017660 A1 | 2/2002 | Villa et al. | |
| 2002/0022261 A1 | 2/2002 | Anderson et al. | |
| 2002/0045244 A1 | 4/2002 | Barlocchi et al. | |
| 2002/0055167 A1 | 5/2002 | Pourahmadi et al. | |
| 2002/0060156 A1 | 5/2002 | Mathies et al. | |
| 2002/0068334 A1 | 6/2002 | Carrino et al. | |
| 2002/0068357 A1 | 6/2002 | Mathies et al. | |
| 2002/0097900 A1 | 7/2002 | Arena et al. | |

FOREIGN PATENT DOCUMENTS

| | | |
|---|---|---|
| EP | 1049157 A1 | 11/2000 |
| EP | 1130631 A1 | 5/2001 |
| EP | 1123739 A1 | 8/2001 |
| WO | -WO96/15576 | 5/1996 |
| WO | -WO98/25701 | 6/1998 |
| WO | -WO00/23190 | 4/2000 |

OTHER PUBLICATIONS van den Berg et al., "Modular Concept for Miniature Chemical Systems," DECHEMA Monographs. vol. 132:109-132, 1996.

Arkilic et al., "Gaseous Slip Flow in Long Microchannels," Journal of Microelectronical Systems 6(2):167-8, 1997.

The World Leader of Photoepoxiesin the MEMES World, URL =hppt:dmtwww.epfl.ch/-lguerin/SU8NF.html, download date of Sep. 23, 1999.

* cited by examiner

PROCESS FOR MANUFACTURING INTEGRATED CHEMICAL MICROREACTORS OF SEMICONDUCTOR MATERIAL

CROSS-REFERENCE TO RELATED APPLICATIONS

This application is a continuation of U.S. application Ser. No. 09/874,382, filed Jun. 4, 2001 now U.S. Pat. No. 6,710,311, entitled "Process for Manufacturing Integrated Chemical Microreactors of Semiconductor Material," and claims priority to EP 00830400.8, filed Jun. 5, 2000, and each is incorporated herein by reference.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

As is known, the treatment of some fluids involves an increasingly precise temperature regulation, in particular when chemical or biochemical reactions are involved. Furthermore, it is frequently necessary to use very small amounts of fluid, since the fluid is costly or not always readily available.

This is, for example, the case of the DNA-amplification process (polymerase chain reaction process, also called a PCR process) wherein precise temperature control in the various phases (it is necessary to repeatedly perform preset thermal cycles), the need to avoid as far as possible thermal gradients in the reaction areas of the fluid (to have uniform temperature in these areas), and also the quantity of fluid used (which is very costly) are of crucial importance for obtaining good reaction efficiency or even for obtaining the reaction itself.

Other examples of treatment of fluids having the characteristics indicated above are, for instance, linked chemical and/or pharmacological analyses, biological tests, etc.

At present, various techniques are available that enable thermal control of chemical or biochemical reagents. A first technique uses a reactor including a glass or plastic base on which a biological fluid is deposited through a pipette. The base rests on a hot-plate called "thermo-chuck," which is controlled by external instrumentation.

Another known reactor comprises a heater, which is controlled by appropriate instrumentation and on which a biological fluid to be examined is deposited. The heater is supported by a base which also carries a sensor arranged in the immediate vicinity of the heater and is also connected to the instrumentation for temperature regulation, so as to enable precise control of the temperature.

Both types of reactors are often enclosed in a protective casing.

A common disadvantage of the known reactors lies in the large thermal mass of the system; consequently, they are slow and have high power absorption. For example, in the case of the PCR process mentioned above, times of the order of 6–8 hours are required.

Another disadvantage of known solutions is linked to the fact that, given the macroscopic dimensions of the reactors, they are able to treat only relatively high volumes of fluids (i.e., minimum volumes of the order of milliliters).

The disadvantages referred to above result in very high treatment costs (in the case of the aforementioned PCR process, the cost can amount to several hundreds of dollars); in addition, they restrict the range of application of known reactors to test laboratories alone.

To overcome the above mentioned drawbacks, starting from the late eighties miniaturized devices of reduced thermal mass have been developed and allow a reduction in the times required for completing the DNA-amplification process.

The first of these devices is described in the article by M. A. Northrup, M. T. Ching, R. M. White, and R. T. Watson, "DNA amplification with a microfabricated reaction chamber," Proc. 1993 IEEE Int. Conf. Solid-State Sens. Actuators, pp. 924–926, 1993, and comprises a reactor cavity formed in a substrate of monocrystalline silicon by anisotropic etching. The bottom of the cavity comprises a thin silicon-nitride membrane, on the outer edge of which are heaters of polycrystalline silicon. The top part of the cavity is sealed with a glass layer. Thanks to its small thermal mass, this structure can be heated at a rate of 15° C./sec., with cycling times of 1 minute. With this device it is possible to carry out, for a volume of fluid of 50 $\mu$l, twenty amplification cycles in periods approximately one fourth the time required by conventional thermocyclers and with a considerably lower power consumption.

However, the described process (as others currently used based on bonding of two silicon substrates previously subjected to anisotropic etches in KOH, TMAH, or other chemical solutions) is costly, has high critical aspects and low productivity, and is not altogether compatible with the usual manufacture steps used in microelectronics.

Other more recent solutions includes forming, inside a first wafer of semiconductor material, buried channels connected to the surface via inlet and outlet trenches, and, inside a second wafer of semiconductor material, reservoirs formed by anisotropic etching, and bonding together of the two wafers.

Also this solution, however, is disadvantageous in that the process is costly, critical, has low productivity, and requires the use of a glass frit for bonding the two wafers together.

BRIEF SUMMARY OF THE INVENTION

The aim of the present invention is therefore to provide a process allowing integration of reservoirs in a single integrated device that includes the chemical microreactor. According to one embodiment of the invention, an integrated microreactor is provided, having a semiconductor material body, one or more buried channels extending in the semiconductor material body at a distance from the surface, first and second trenches extending from the surface respectively as far as first and second ends of the buried channels, and a resist layer extending above the surface and defining first and second reservoirs connected to the first and second trenches. A process for the fabrication of an integrated microreactor is encompassed by the invention, including forming a semiconductor material body having one or more buried channels, forming first and second trenches extending from the surface of the semiconductor body as far as, respectively, first and second ends of the buried channels and forming first and second reservoirs above the surface, respectively connected to the first and second trenches. A method for the use of a microreactor is also described as part of the invention. The method includes introducing a fluid from a reservoir into a reactor cavity, where the reactor cavity is a buried channel extending in a semiconductor material body at a distance from a surface of the semiconductor material body, where the reservoir is formed in a resist layer on the surface of the semiconductor material body, and where the fluid is introduced via a trench extending from the reservoir on the surface of the semiconductor material body as far as one end of the buried channel, then heating the fluid within the reaction chamber, and cooling the fluid within the reaction chamber. This method may also include removal of the fluid from the reaction chamber into a second reservoir, also formed in the resist layer on the surface of the semiconductor material body where the fluid may be sampled by the use of a sensing electrode for the presence of a product of the method.

BRIEF SUMMARY OF THE DRAWINGS

For a better understanding of the present invention, two preferred embodiments thereof are now described, simply as non-limiting examples, with reference to the attached drawings, wherein.

DETAILED DESCRIPTION OF THE INVENTION

Figure 1:
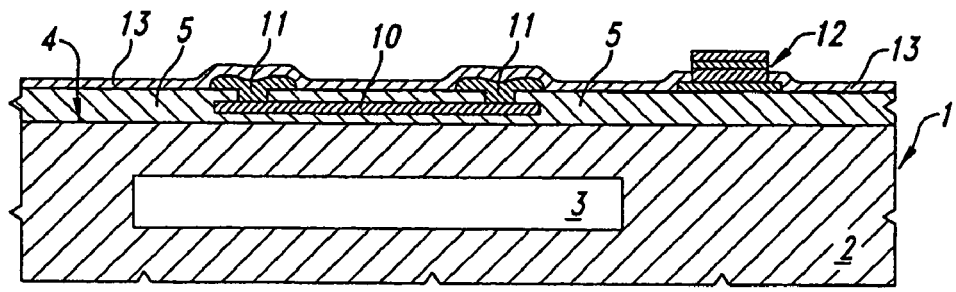
FIGS. 1–5 show cross-sections through a wafer of semiconductor material in successive manufacturing steps of a microreactor according to a first embodiment of the invention.
Figure 6:
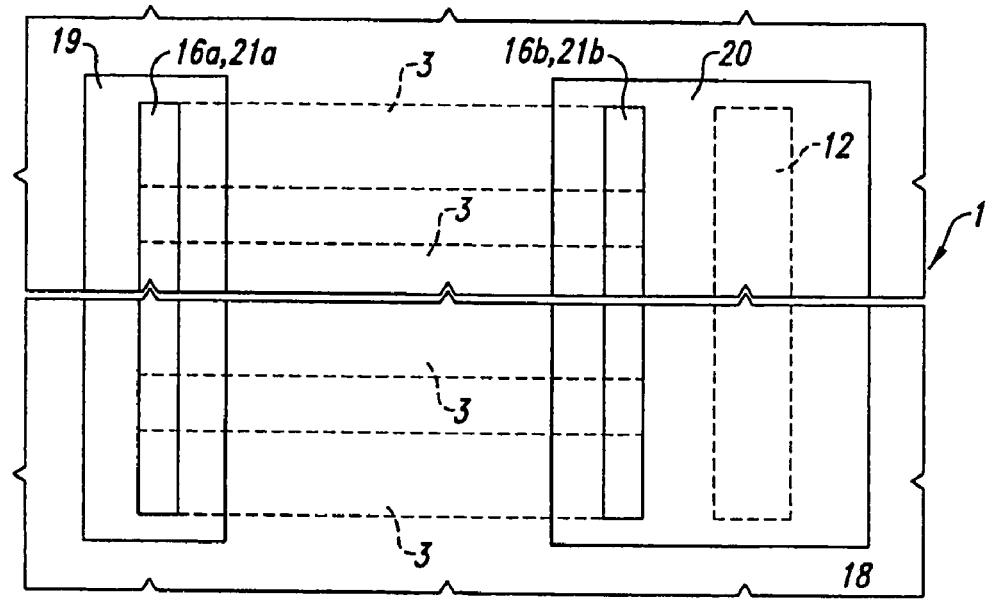
FIG. 6 shows a top view of the wafer of FIG. 5.

FIG. 1 shows a wafer 1 comprising a semiconductor body 2, typically of monocrystalline silicon, accommodating buried channels 3 extending parallel to a surface 4 of the semiconductor body 2. Preferably, as indicated in the top view of FIG. 6 by dashed lines, a plurality of buried channels 3 extend parallel to one another at short distances. In this case, the buried channels 3 may have an approximately circular or rectangular section and are arranged at a distance of 50 $\mu$m from one another and at a depth of 20–30 $\mu$m from the surface 4. When the buried channels 3 have a rectangular cross-section, they have an area of 30 $\mu$m×200 $\mu$m, and a length of 10 mm, and the total area occupied by the buried channels 3 is 50 mm$^2$. Alternatively, it is possible to have a single channel, approximately 10 mm in length, approximately 5 mm in width, and approximately 20 $\mu$m in height. In both cases, a total volume is obtained of approximately 1 mm$^3$ (1 $\mu$l).

A first insulating layer 5, for example of silicon dioxide, extends on top of the surface 4 of the semiconductor body 2 and accommodates a polycrystalline-silicon heating element 10. Preferably, the heating element 10 extends substantially over the area occupied by the buried channels 3, but not over the longitudinal ends of the buried channels 3, where inlet and outlet openings of the channels 3 are to be formed, as described hereinafter.

Contact regions 11, for example of aluminum, extend through openings of the first insulating layer 5 and are in electrical contact with two opposite ends of the heating element 10 to enable passage of electric current through the heating element 10 and heating of the underlying area.

A sensing electrode 12 formed by a multilayer, for example of aluminum, titanium, nickel and gold, in a per se known manner and thus not described in detail, extends on top of the first insulating layer 5, laterally shifted with respect to the buried channels 3.

A second insulating layer 13, for example of TEOS (tetra-ethyl orthosilicate) oxide extends on top of the first insulating layer 5 and has an opening through which the sensing electrode 12 protrudes.

The wafer 1 of FIG. 1 is obtained, for example, as described below. Initially, the buried channels 3 are formed, preferably according to the teaching of European patent applications 99830206.1 of May 9, 1999, and 00830098.0 of Feb. 11, 2000, filed by the present applicant and incorporated herein for reference. Initially, a substrate of monocrystalline silicon is time etched in TMAH to form the channels 3. Then the channels 3 are preferably coated with a material inhibiting epitaxial growth, and a monocrystalline epitaxial layer is grown on top of the substrate and of the channels. The epitaxial layer closes at the top the buried channels 3 and forms, together with the substrate, the semiconductor body 2 in which, if so envisaged, control electronic components may be integrated at the sides of the buried channels.

Subsequently, and in succession, the following steps are performed: the bottom portion of the first insulating layer 5 is deposited on the surface 4; a polycrystalline silicon layer is deposited and defined so as to form the heating element 10; the top portion of the first insulating layer 5 is formed; openings are made in the first insulating layer 5; an aluminum layer is deposited and defined to form the contact regions 11 and the bottom region of the sensing electrode 12; the second insulating layer 13 is deposited and then removed from the area corresponding to the sensing electrode 12; and next the aluminum, titanium, nickel and gold regions forming the sensing electrode 12 are formed.

Subsequently (FIG. 2), a protective layer 15 is formed. For this purpose, a layer of standard positive resist may be deposited, for example including three components, formed by a NOVOLAC resin, a photosensitive material or "pac" (photo-active compound), and a solvent, such as ethylmethyl ketone and lactic acid, used normally in microelectronics for the definition of integrated structures. Alternatively, another compatible material may be used, which can be defined and is capable of resisting etching both of the silicon of the semiconductor body 2 and of the material still to be deposited on top of the protective layer 15, such as a TEOS oxide, in which case the protective layer 15 blends with the second protective layer 13.

Figure 3:
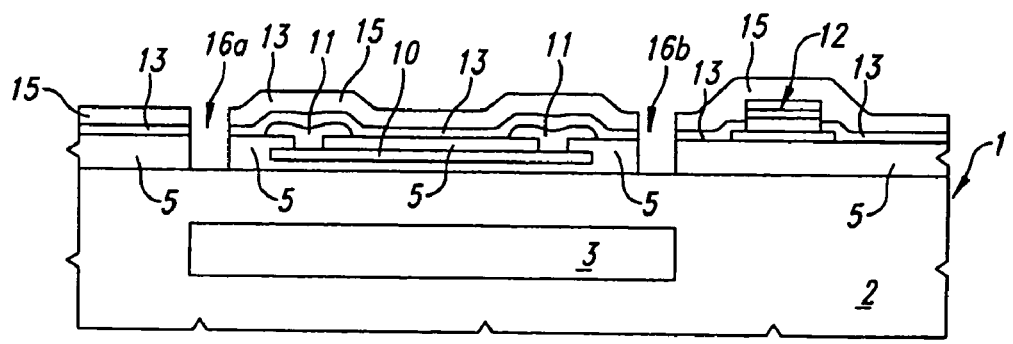

Next (FIG. 3), the protective layer 15 is defined and, where the protective layer 15 has been removed, the second insulating layer 13 and first insulating layer 5 are etched. In this way, an inlet opening 16a and an outlet opening 16b are obtained that extend as far as the surface 4 of the semiconductor body 2 and are basically aligned to the longitudinal ends of the channels 3. The inlet opening 16a and outlet opening 16b preferably have a length of approximately 5 mm (in a direction perpendicular to the plane of the drawing) and a width of approximately 60 $\mu$m.

Figure 4:
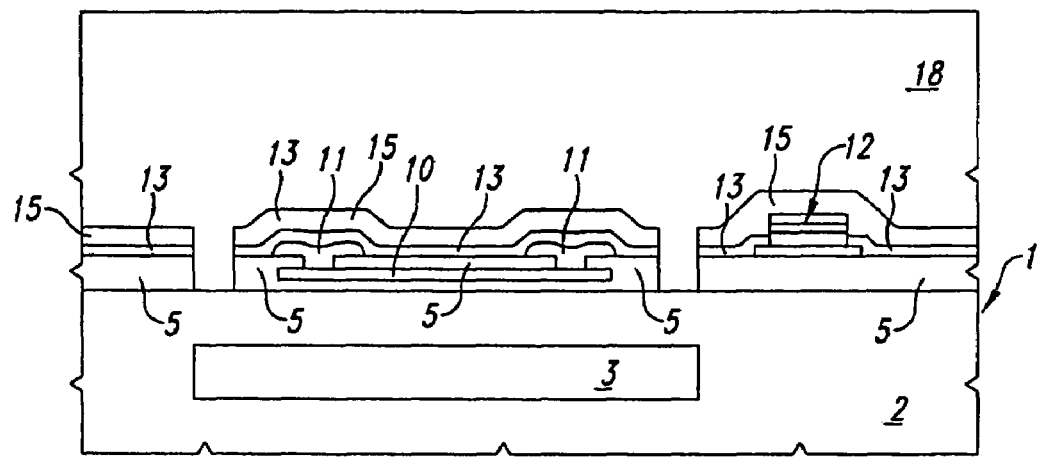

A resist layer 18 is then deposited (FIG. 4), in the example illustrated the resist being negative and having a thermal conductivity of between 0.1 and 1.4 W/m° K and a thermal expansion coefficient TEC≦50 ppm/°K, such as the material known under the name "SU8" (Shell Upon 8) produced by SOTEC MICROSYSTEMS. For example, the resist layer 18 has a thickness of between 300 $\mu$m and 1 mm, preferably 500 $\mu$m.

Figure 5:
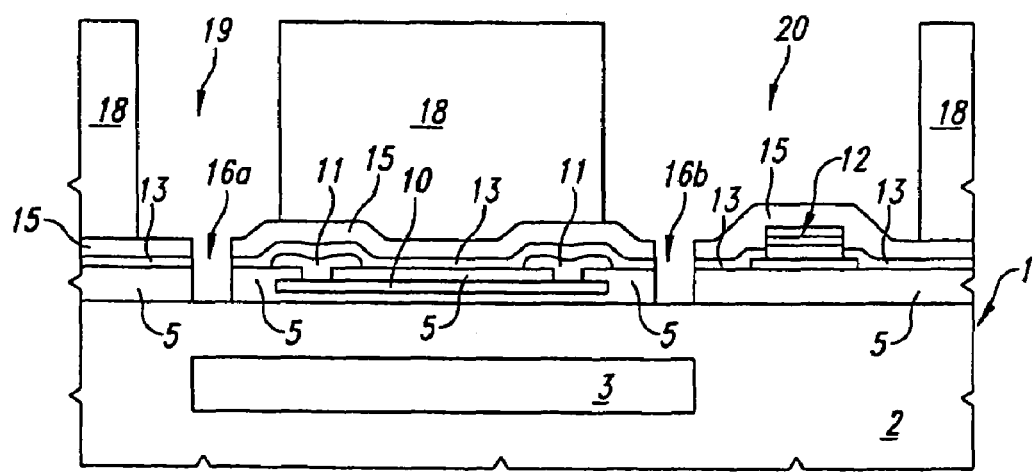

Subsequently (FIG. 5), the resist layer 18 is defined so as to form an inlet reservoir 19 and an outlet reservoir 20. In particular, and as shown in the top view of FIG. 6, wherein the channels 3 are represented by dashed lines, the outlet reservoir 20 is formed as an extension of the outlet opening 16b (and thus is connected to the ends of the channels 3 close to the sensing electrode 12) and encompasses the sensing electrode 12. The inlet reservoir 19 is formed, instead, as an extension of the inlet opening 16a, and is thus connected to the opposite ends of the channels 3. Preferably, the reservoirs 19, 20 have a length (in a direction perpendicular to the plane of FIG. 5) of approximately 6 mm; the inlet reservoir 19 has a width (in a horizontal direction in FIG. 5) of between 300 μm and 1.5 mm, preferably approximately 1 mm, so as to have a volume of at least 1 mm3, and the outlet reservoir 20 has a width of between 1 and 4 mm, preferably of approximately 2.5 mm.

Figure 7:
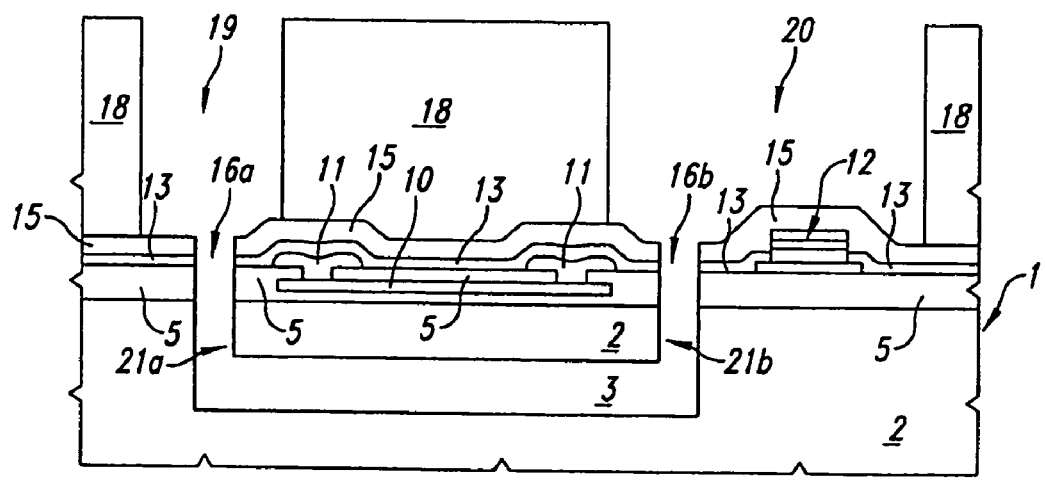
FIGS. 7 and 8 show cross-sections similar to those of FIGS. 1–5, in final manufacturing steps.

Next (FIG. 7), using as masking layer the resist layer 18 and the protective layer 15, access trenches 21a and 21b are formed in the semiconductor body 2 by performing a trench etching. In particular, the access trenches 21a and 21b extend aligned to the inlet and outlet openings 16a, 16b, from the surface 4 as far as the channels 3, so as to connect the channels 3 to one another in parallel, as well as to the inlet reservoir 19 and the outlet reservoir 20.

Figure 8:
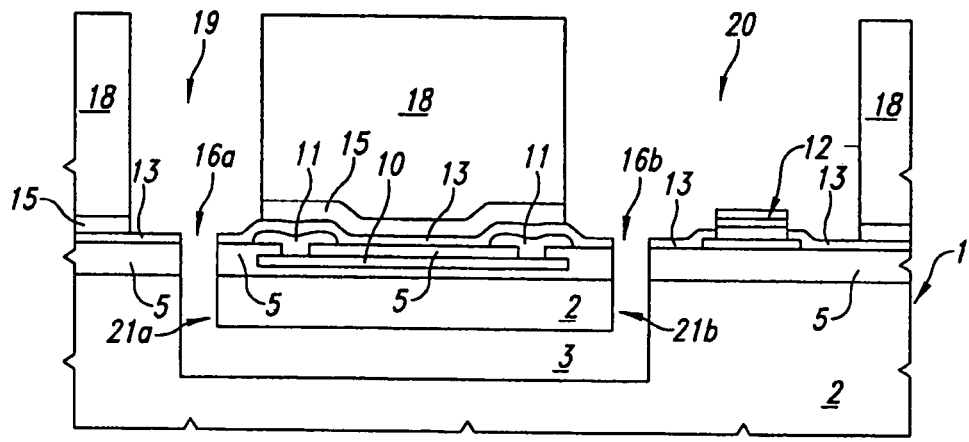

Finally, the exposed portion of the protective layer 15 is removed, so as to expose the sensing electrode 12 again (FIG. 8), and the wafer 1 is cut into dice to obtain a plurality of microreactors.

According to a different embodiment, the inlet and outlet reservoirs are formed in a photosensitive dry-resist layer. In this case, the access trenches can be made before applying the photosensitive, dry resist layer.

Figure 2:
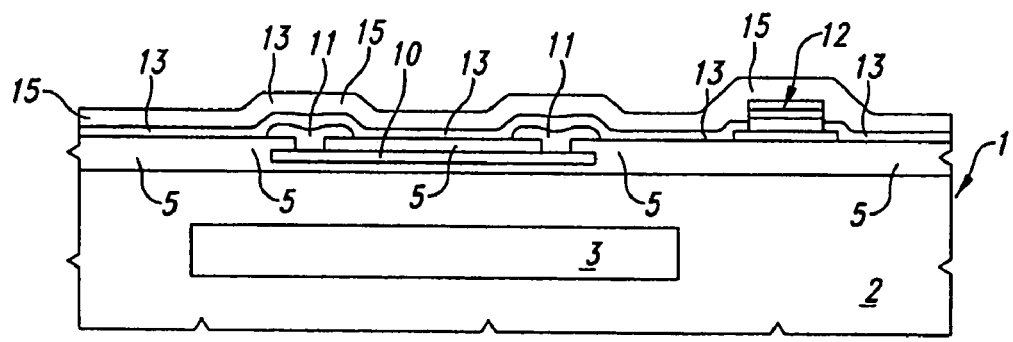

According to an implementation of this embodiment, wherein parts corresponding to those of the first embodiment are designated by the same reference numbers, the process starts from a wafer 1, as shown in FIG. 2, comprising the semiconductor body 2, in which the buried channels 3 have already been formed. The first insulating layer 5, the heating element 10, the contact regions 11, the sensing electrode 12, the second insulating layer 13, and the protective layer 15 are also already formed on the semiconductor body 2.

Figure 9:
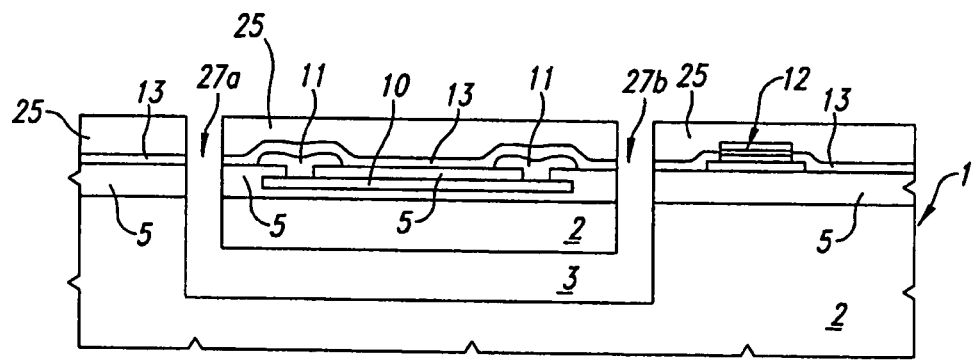
FIGS. 9–12 show cross-sections through a wafer of semiconductor material in successive manufacturing steps of a microreactor according to a second embodiment of the invention.

Subsequently (FIG. 9), using a special masking layer (not shown), the protective layer 15, the second insulating layer 13, the first insulating layer 5, and the semiconductor body 2 are etched to form inlet openings 27a and outlet openings 27b at the ends of the buried channels 3. In practice, the inlet opening 27a of FIG. 9 corresponds to the opening 16a and the trench 21a of FIG. 7, and the outlet opening 27b of FIG. 9 corresponds to the opening 16b and the trench 21b of FIG. 7. If so required, the wafer 1 may be planarized.

Figure 10:
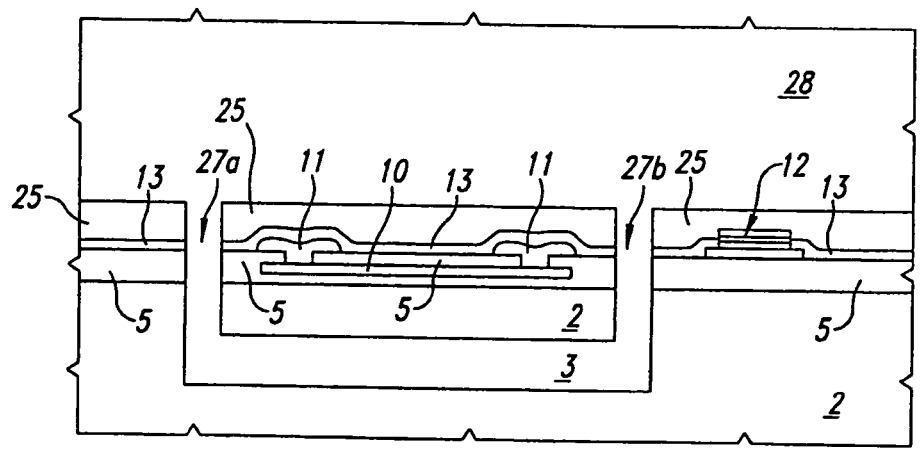

Subsequently (FIG. 10), a resist layer 28 is applied. Here the resist layer 28 is made of a photosensitive dry resist, of the type currently used for printed circuits, wherein the photosensitive dry resist, supplied in rolls of various sizes and thicknesses, is applied to the base coated with a copper layer, and is then laminated and thermocompressed. According to the invention, preferably a photosensitive dry resist layer is used of an opposite type with respect to the protective layer 15 (here negative) having a thickness of between 500 μm and 1 mm, which is made to adhere to the wafer 1 by lamination at a temperature of 105–118° C. and is cut according to the external profile of the wafer 1.

Figure 11:
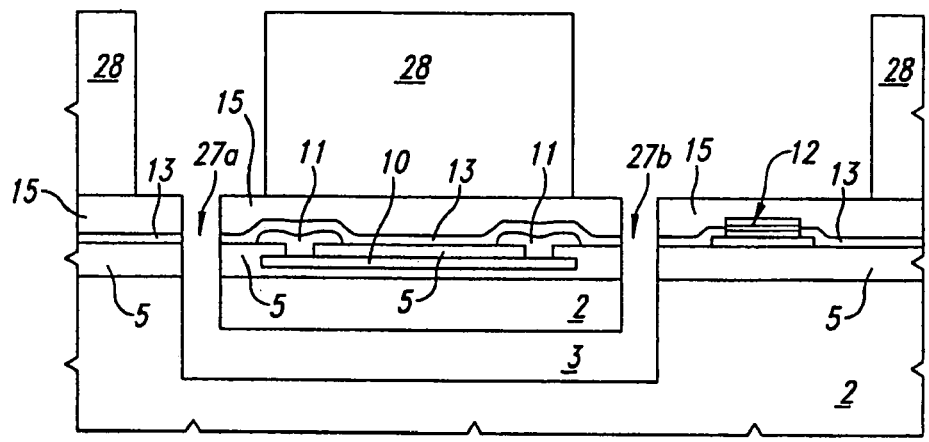
Figure 12:
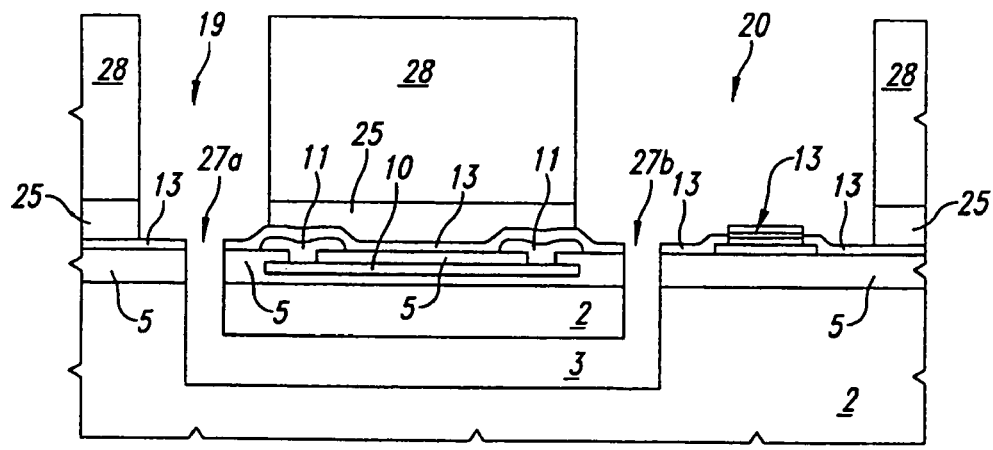

The resist layer 28 is then exposed (using a special mask), developed and etched so as to form the inlet reservoir 19 and the outlet reservoir 20, thus obtaining the structure shown in FIG. 11. Finally, the uncovered portion of the protective layer 15 is removed so as to expose the sensing electrode 12 again (FIG. 12).

The advantages of the described process and device are the following. First, an integrated microreactor formed in a single piece may be obtained, without bonding two wafers of silicon and/or glass together. The process involves steps that are usual in microelectronics, with decidedly lower costs than the current ones. The process is moreover far from critical, affords high productivity, and does not require the use of materials (such as "glass flit") which are difficult to use on account of their deformability.

The method of operation of the device is as follows according to one embodiment of the invention. The buried channels 3 function as a reactor cavity. A reactive fluid is introduced into the inlet reservoir 19 and thence into the buried channels 3 via the access trench 21a. This may be accomplished by capillary action or by appropriate air pressure, or other acceptable techniques. In the case of a PCR operation, the fluid is heated and cooled repeatedly according to specific parameters, which parameters may be custom for each particular applications and fluid type. The setting of such parameters is within the skill of those in the art. The heating is accomplished by the use of the heating element 10 as described herein. The cooling step may be carried out by removing the heat and permitting the fluid to cool towards the ambient. Cooling may be accelerated by the use of a heat sink attached in a known manner to the semiconductor body 2. Other cooling means may be employed as appropriate, for example, a cooling fan or by the circulation of a liquid coolant.

At the conclusion of the heating and cooling cycles the fluid is removed from the buried channels 3 via the access trench 21b, into the outlet reservoir 20, by the application of air pressure, or by other means as appropriate. In some cases the fluid may be removed from the outlet reservoir 20 for further processing. In one embodiment, the sensing electrode 12 is employed to detect a desired product of the reaction process in the fluid. This detection process is within the skill of those practiced in the art, and so will not be described in detail.

Having the sensor electrode 12 in the same semiconductor substrate and adjacent to the channel 3 is advantageous for certain types of such processes. Of course, other process sequences do not employ such a sensor 12 and it does not need to be used in all embodiments of the invention.

Finally, it is clear that numerous variations and modifications may be made to the process and to the microreactor described and illustrated herein, all falling within the gist of the invention, as defined in the attached claims. For example, the type of resist used for forming the resist layer and the protective layer may be different from the ones described herein. For instance, the protective layer 15 may be made with a negative, instead of positive, resist or with another protective material resistant to the etching of the resist layer and of the silicon, and selectively removable with respect to the second insulating layer 13; and the resist layer may be made with a positive resist, instead of a negative one. Instead of a plurality of buried channels, it is possible to make a single buried channel of appropriate dimensions, for example applying the technique described in the aforementioned European Patent Application 99830206.1 and time etching the silicon of the semiconductor body 2 extending between the buried channels 3 so as to form a single cavity having a width equal to that of the trenches 21a, 21b or of the openings 27a, 27b. In addition, in the second embodiment, the resist layer 28 may be replaced by two layers, the bottom layer having a function of support for the top one.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising applying a biological fluid to an integrated microreactor comprising:
   a semiconductor material body having a surface;
   a buried channel extending in said semiconductor material body at a distance from said surface, and having a first and a second end;
   a first and a second trench extending from said surface respectively as far as said first and second ends of said buried channel, and being in fluid connection with said buried channel;
   a reservoir region formed on the surface of the semiconductor material body, extending above said surface and defining a first and a second reservoir connected to said first and second trenches, respectively;
   wherein the biological fluid is applied to the first reservoir and travels via the first trench to the buried channel where a biological test is performed, and wherein the biological fluid then travels via the second trench to the second reservoir.

2. The method of claim 1, wherein the integrated devise further comprises a heating element arranged between said surface and said reservoir region, above said buried channel.

3. The method of claim 2, wherein the integrated device further comprises an insulating material region surrounding said heating element.

4. The method of claim 1, wherein the second reservoir further comprises a sensing electrode structure inside said second reservoir; where the sensing electrode senses the product of said biological test.

5. The method of claim 4, wherein said first and second reservoirs have, in cross section, larger areas than said first and second trenches.

6. The method of claim 5, wherein the biological fluid contains DNA and wherein the biological test comprises amplification and the product of said biological test is amplified DNA.

7. A method, comprising applying a biological fluid to an integrated microreactor comprising:
   a semiconductor material body having a surface;
   a buried channel extending in said semiconductor material body at a distance from said surface, and having a first and a second end;
   a first and a second trench extending from said surface respectively as far as said first and second ends of said buried channel, and being in fluid connection with said buried channel;
   a reservoir region formed on the surface of the semiconductor material body, extending above said surface and defining first and second reservoirs connected to said first and second trenches, respectively; and
   a heating element arranged between said surface and said reservoir region, above said buried channel;
   wherein the biological fluid is applied to the first reservoir and travels via the first trench to the buried channel where a biological test is performed, and wherein the biological fluid then travels via the second trench to the second reservoir.

8. The method of claim 7, the integrated microreactor further comprising an insulating material region surrounding said heating element.

9. The method of claim 8, the integrated microreactor further comprising a protective region arranged between said insulating material region and said reservoir region.

10. The method of claim 9, wherein the reservoir region is of a first resist and the protective region is of a second resist, and in that one of said resists is of a negative type and the other of said resists is of a positive type.

11. The method of claim 10, wherein said first resist is SU8.

12. The method of claim 11, wherein said first resist is a photosensitive dry resist.

13. The method claim 12, wherein the biological fluid contains DNA and wherein the biological test comprises amplification and the product of said biological test is amplified DNA.

14. A method, comprising:
   introducing a biological fluid from a first reservoir into a first trench, the first reservoir and first trench being integrated in a semiconductor body, the first trench being formed in, and defined by, a resist layer formed on the surface of the semiconductor material body;
   moving the biological fluid from the first trench into a buried channel, the buried channel extending in the semiconductor body at a distance from a surface of the semiconductor body, the first trench extending from the reservoir on the surface of the semiconductor material body to a first end of the buried channel;
   the semiconductor material body having at least one integrated heating element positioned to heat the buried channel and an insulating material region surrounding said heating element;
   heating and optionally cooling the biological fluid within the buried channel;
   optionally repeating the heating and cooling steps as needed;
   extracting the biological fluid from the buried channel into a second reservoir via a second trench, the second reservoir and second trench being integrated in the semiconductor body, the second trench extending from the second reservoir on the surface of the semiconductor material body as far as a second end of the buried channel; and
   detecting a product within the biological fluid, where the detection step is performed by the use of an electrode, the electrode being integrated in the second reservoir.

15. The method of claim 14, wherein the biological fluid contains DNA and the product is amplified DNA.

* * * * *

UNITED STATES PATENT AND TRADEMARK OFFICE
CERTIFICATE OF CORRECTION

PATENT NO.         : 7,009,154 B2
APPLICATION NO. : 10/784509
DATED                 : March 7, 2006
INVENTOR(S)       : Villa et al.

It is certified that error appears in the above-identified patent and that said Letters Patent is hereby corrected as shown below:

On The Title Page, the following should be inserted in the left column:

Item (30)     Foreign Application Priority Data

June 5, 2000   (EP)  ……………………...00830400

Signed and Sealed this

Seventh Day of November, 2006

JON W. DUDAS
*Director of the United States Patent and Trademark Office*